(12) United States Patent
Lam

(10) Patent No.: US 10,897,130 B2
(45) Date of Patent: Jan. 19, 2021

(54) MICRO PLASMA LIMITER FOR RF AND MICROWAVE CIRCUIT PROTECTION

(71) Applicant: The Boeing Company, Chicago, IL (US)

(72) Inventor: Tai Anh Lam, Renton, WA (US)

(73) Assignee: THE BOEING COMPANY, Chicago, IL (US)

( * ) Notice: Subject to any disclaimer, the term of this patent is extended or adjusted under 35 U.S.C. 154(b) by 441 days.

(21) Appl. No.: 15/942,004

(22) Filed: Mar. 30, 2018

(65) Prior Publication Data

US 2019/0305548 A1  Oct. 3, 2019

(51) Int. Cl.

| | |
|---|---|
| *H02H 9/02* | (2006.01) |
| *B64D 45/00* | (2006.01) |
| *H01P 3/08* | (2006.01) |
| *H01P 7/08* | (2006.01) |
| *H01P 1/14* | (2006.01) |
| *H03G 11/00* | (2006.01) |
| *H05K 1/02* | (2006.01) |

(52) U.S. Cl.
CPC ............... *H02H 9/02* (2013.01); *B64D 45/00* (2013.01); *H01P 1/14* (2013.01); *H01P 3/081* (2013.01); *H01P 7/08* (2013.01); *H03G 11/004* (2013.01); *H03G 11/006* (2013.01); *H05K 1/0237* (2013.01); *H05K 1/0263* (2013.01)

(58) Field of Classification Search
CPC .. H02H 9/02; H02H 9/045; H01P 1/14; H01P 3/081; H01P 7/08; H03G 11/004; H03G 11/006; B64D 45/00; H05K 1/0237; H05K 1/0263

USPC ....................................................... 361/107
See application file for complete search history.

(56) References Cited

U.S. PATENT DOCUMENTS

| | | | |
|---|---|---|---|
| 3,113,278 A | * 12/1963 | Okwit | H03G 11/006 333/24.2 |
| 4,575,692 A | 3/1986 | Goldie | |
| 9,728,835 B2 | 8/2017 | Lam et al. | |
| 2015/0244048 A1 | * 8/2015 | Poust | H01T 4/16 361/112 |
| 2019/0074596 A1 | 3/2019 | Lam | |

OTHER PUBLICATIONS

Skyworks Solutions, Inc., "Application Note—PIN Limiter Diodes in Receiver Protectors," 200480 Rev. C, Aug. 15, 2008, pp. 1-12.
Partial EP Search Report for EP 19165732.2 and Provisional Opinion Accompanying the Partial Search Report, dated Aug. 14, 2019, pp. 1-14.

(Continued)

*Primary Examiner* — Dharti H Patel
(74) *Attorney, Agent, or Firm* — Coats & Bennett, PLLC

(57) ABSTRACT

A protection circuit configured to protect delicate electronics from high power signals is disclosed herein. To that end, the protection circuit includes a limiter circuit comprising a phase changing material to prevent high power signals from reaching one or more electronic circuits. The phase changing material assumes a limiting state automatically when an energy of an applied signal exceeds a threshold, which limits the energy of the signal passed on to any associated electronics.

20 Claims, 8 Drawing Sheets

(56) References Cited

OTHER PUBLICATIONS

Cross, L. et al., "Theory and Demonstration of Narrowband Bent Hairpin Filters Integrated With AC-Coupled Plasma Limiter Elements", IEEE Transactions on Electromagnetic Compatibility, vol. 55, No. 6, Dec. 1, 2013, pp. 1100-1106, IEEE.
The Extended European Search Report for EP 19165732.9 dated Jan. 24, 2020, dated Jan. 2, 2020, with annex, pp. 1-14.
Horton, J. et al., "A One-GHz Ferroelectric Limiter", IEEE Transactions on Microwave Theory and Techniques, Plenum, USA, vol. 15, No. 9, Sep. 1, 1967, pp. 517-523, IEEE.

* cited by examiner

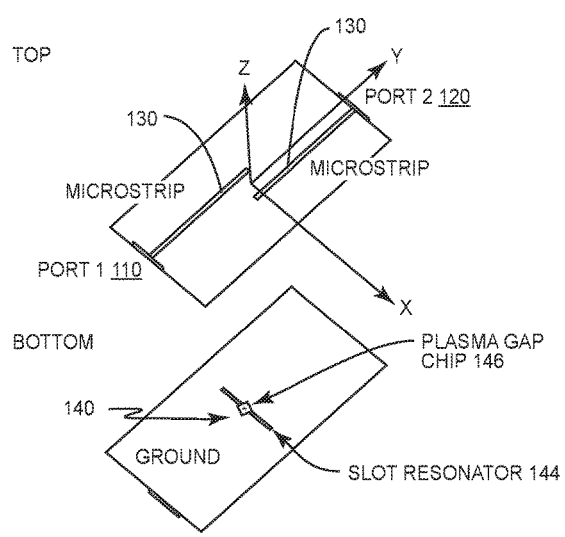
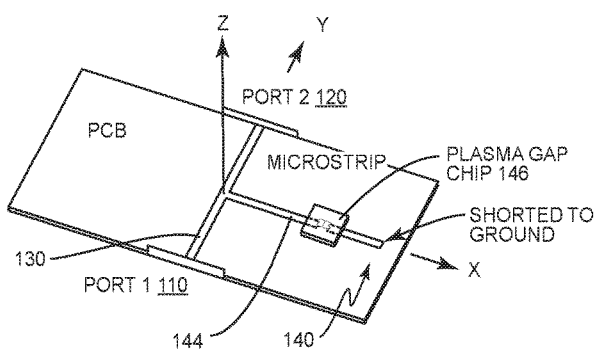
FIG. 9
FIG. 10

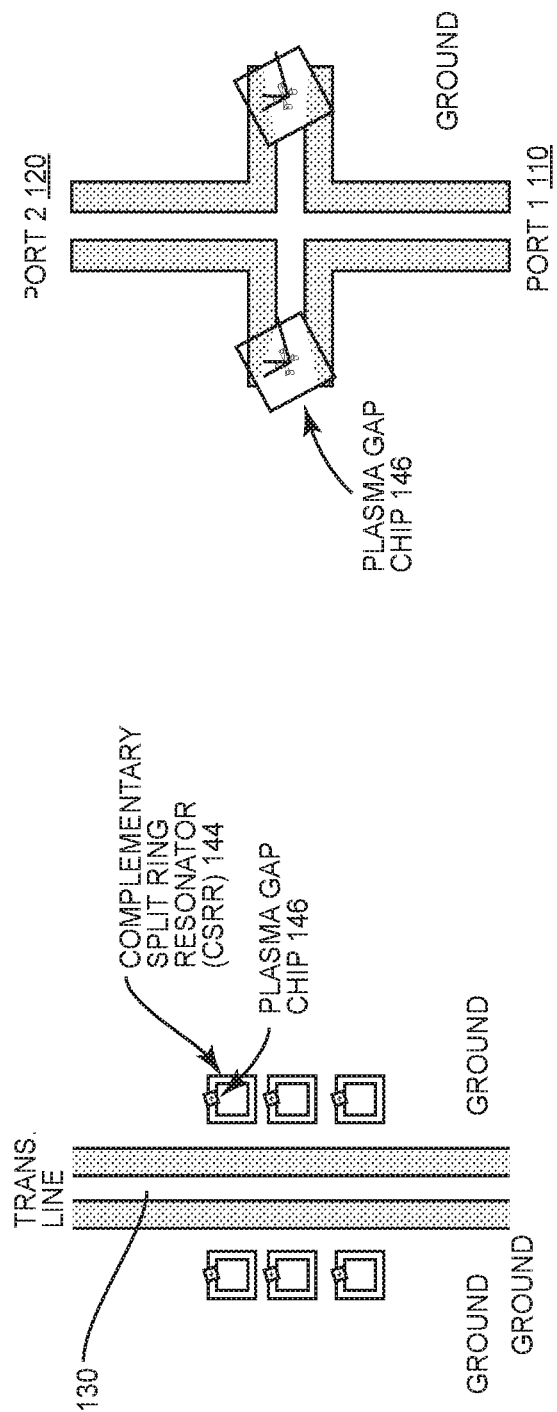

MICRO PLASMA LIMITER FOR RF AND MICROWAVE CIRCUIT PROTECTION

BACKGROUND

Many electronic circuits are susceptible to damage caused by high power signals. For example, Radio Frequency (RF) equipment, e.g., low noise amplifiers, down converter mixer circuits, etc., designed to detect low power signals, signals in noisy environments, etc., are generally susceptible to being damaged by high power signals. Such high power signals may present in any number of forms (e.g., high power microwave signals, electromagnetic pulses, etc.) and/or be caused by any number of circumstances (e.g., signals transmitted by radar transmitters, lightning strikes, power supply surges, static electricity, interference, co-site interference for simultaneous transmit/receive systems, etc.). Thus, it is necessary to either prevent such high power signals from happening, or to provide some means to protect delicate electronics from such high power signals.

Conventional electrical systems may use a surge protection device to prevent high power signals from reaching the delicate electronics. For example, current limiters may use special diodes, e.g., P-doped, Intrinsic, N-doped (PIN) diodes, to block high power signals. Such protection circuits, however, are expensive, have a limited power handling capacity, and/or have a high insertion loss. As such, there remains a need for improved protection circuits that protect power-sensitive electronics from high power signals.

SUMMARY

The present disclosure relates to methods, apparatuses, systems, computer program products, software, and/or mediums for improved protection from high power signals. To that end, aspects presented herein use a limiter circuit comprising a phase changing material to prevent high power signals from reaching one or more electronic circuits. The phase changing material assumes a limiting state when an energy of an applied signal exceeds a threshold, which limits the energy of the signal passed on to any associated electronics.

The present disclosure discloses a protection circuit configured to protect one or more electronic circuits from high power signals. The protection circuit comprises a first port, a second port, a transmission line, and a limiter circuit. The first port and the second port electrically connect to opposing ends of the transmission line. The second port is operatively coupled to the one or more electronic circuits. The limiter circuit is operatively coupled to the transmission line and comprises a phase changing material in communication with a resonator. The phase changing material is configured in a limiting state when an energy of a signal received at the first port exceeds a threshold to limit an energy of the signal at the second port.

According to a further aspect, the phase changing material is configured in a non-limiting state when the energy of the signal received at the first port is less than the threshold.

According to a further aspect, the limiter circuit is selectively electrically coupled between the transmission line and ground, the limiting state comprises a conductive state, and the phase changing material is configured in the conductive state when the energy of the signal received at the first port exceeds the threshold to redirect at least a portion of the energy of the signal received at the first port to the ground.

According to a further aspect, the limiter circuit is disposed proximate the transmission line, the limiting state comprises an electromagnetic coupling state, and the phase changing material is configured in the electromagnetic coupling state when the energy of the signal received at the first port exceeds the threshold to mismatch an impedance of the first port relative to an impedance of the second port.

According to a further aspect, the phase changing material configured in the limiting state absorbs at least some of the energy of the signal received at the first port to limit the energy of the signal at the second port.

According to a further aspect, the protection circuit further comprises a gap chip comprising a sealed chamber, a first conductor, and a second conductor. The phase changing material is disposed in the sealed chamber. The first conductor is at least partially disposed within the sealed chamber and extends from the sealed chamber. The second conductor is spaced from the first conductor, is at least partially disposed within the sealed chamber, and extends from the sealed chamber, where the first and second conductors electrically connect to the resonator.

According to a further aspect, the phase changing material comprises air.

According to a further aspect, the phase changing material comprises a noble gas, a thermochromic material, or an electrochromic material.

According to a further aspect, the resonator comprises a slot resonator comprising a gap between two conductive elements, the phase changing material is disposed in the gap, and the limiting state comprises a conductive state that electrically connects the two conductive elements of the slot resonator.

According to a further aspect, the resonator comprises a quarter wave resonator selectively connected to ground via the phase changing material, and the limiting state comprises a conductive state that electrically connects the quarter wave resonator to the ground.

According to a further aspect, the threshold comprises a fixed threshold.

According to a further aspect, the limiter circuit further comprises a bias connector electrically connected to the resonator, where the threshold comprises a variable threshold controlled by a bias signal applied to the bias connector.

The present disclosure also discloses a method of protecting one or more electronic circuits from high power signals. The method comprises receiving a signal at a first port of a transmission line. The transmission line comprises the first port and a second port on opposing ends. The second port is operatively coupled to the one or more electronic circuits. The method also comprises limiting an energy of the signal at the second port when an energy of the signal received at the first port exceeds a threshold using a phase changing material configured in a limiting state. The phase changing material is in communication with a resonator operatively connected to the transmission line.

According to a further aspect, the method further comprises passing the energy of the signal at the first port to the second port when the energy of the signal received at the first port is less than the threshold using the phase changing material configured in a non-limiting state.

According to a further aspect, the limiting state comprises a conductive state, the phase changing material in communication with the resonator is selectively electrically coupled between the transmission line and ground, and limiting the energy of the signal at the second port comprises redirecting at least a portion of the signal received at the first port to ground by using the phase changing material configured in the conductive state responsive to the energy of the signal received at the first port exceeding the threshold.

According to a further aspect, the limiting state comprises an electromagnetic coupling state, the phase changing material in communication with the resonator is disposed proximate the transmission line, and limiting the energy of the signal at the second port comprises mismatching an impedance of the first port relative to the second port by using the phase changing material configured in the electromagnetic coupling state when the energy of the signal received at the first port exceeds the threshold.

According to a further aspect, the threshold comprises a fixed threshold.

According to a further aspect, the threshold comprises a variable threshold, the method further comprising controlling the threshold by controlling a bias signal applied to the resonator.

The present disclosure also discloses an aircraft comprising one or more electronic circuits, and a protection circuit. The one or more electronic circuits are configured to control an operation of the aircraft. The protection circuit comprises a first port, a second port, a transmission line, and a limiter circuit. The first port and the second port electrically connect to opposing ends of the transmission line. The second port is operatively coupled to the one or more electronic circuits. The limiter circuit is operatively coupled to the transmission line and comprises a phase changing material in communication with a resonator. The phase changing material is configured in a limiting state when an energy of a signal received at the first port exceeds a threshold to limit an energy of the signal at the second port.

According to a further aspect, the limiter circuit further comprises a bias connector electrically connected to the resonator, where the threshold comprises a variable threshold controlled by a bias signal applied to the bias connector.

BRIEF DESCRIPTION OF THE DRAWINGS

FIG. 9 shows a Printed Circuit Board (PCB) with an exemplary slot resonator aspect.

FIG. 10 shows a PCB with an exemplary shunt-to-ground aspect.

FIG. 11 shows a PCB with an exemplary aspect comprising multiple limiter circuits.

FIG. 12 shows a PCB with another exemplary aspect comprising multiple limiter circuits.

DETAILED DESCRIPTION

Aspects of the present disclosure are directed to methods, apparatuses, systems, computer program products, and/or software for limiting the energy of a signal applied to electronic circuits, particularly those circuits that could be damaged by high power signals. The aspects presented herein are described in terms of electronic circuit protection, particularly the protection of RF circuits in general and on an aircraft in particular. It will be appreciated, however, that the aspects presented herein are not limited to aircraft electronics, but rather apply to any electronics that are sensitive to, and may be damaged by, high power signals.

Figure 1:
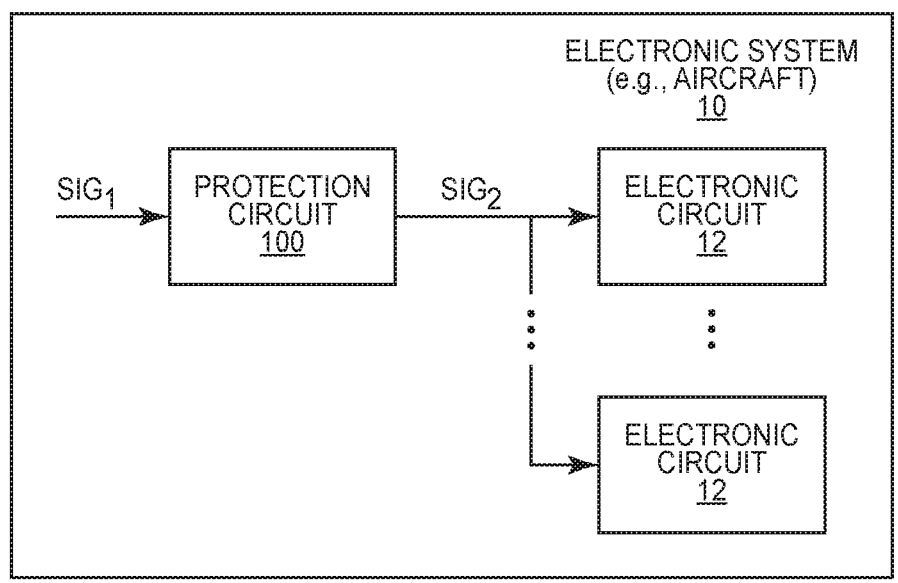
FIG. 1 shows a block diagram of an electronic system according to one exemplary aspect.

FIG. 1 shows a block diagram of an aspect of an electronic system 10, e.g., on an aircraft. Electronic system 10 comprises one or more electronic circuits 12 and a protection circuit 100. The electronic circuits 12 may comprise any electronic circuit that is sensitive to, or may be damaged by, high power signals. Exemplary electronic circuits 12 include, but are not limited to, radar systems, communication systems, sensing systems, low noise amplifiers, down converter mixers, etc. Protection circuit 100 protects the electronic circuits 12 from high power/high energy signals by at least partially blocking and/or redirecting the high power signals using a phase changing material that changes to a limiting state when $SIG_1$ is a high power signal, e.g., when the energy of $SIG_1$ exceeds a threshold.

Figure 2:
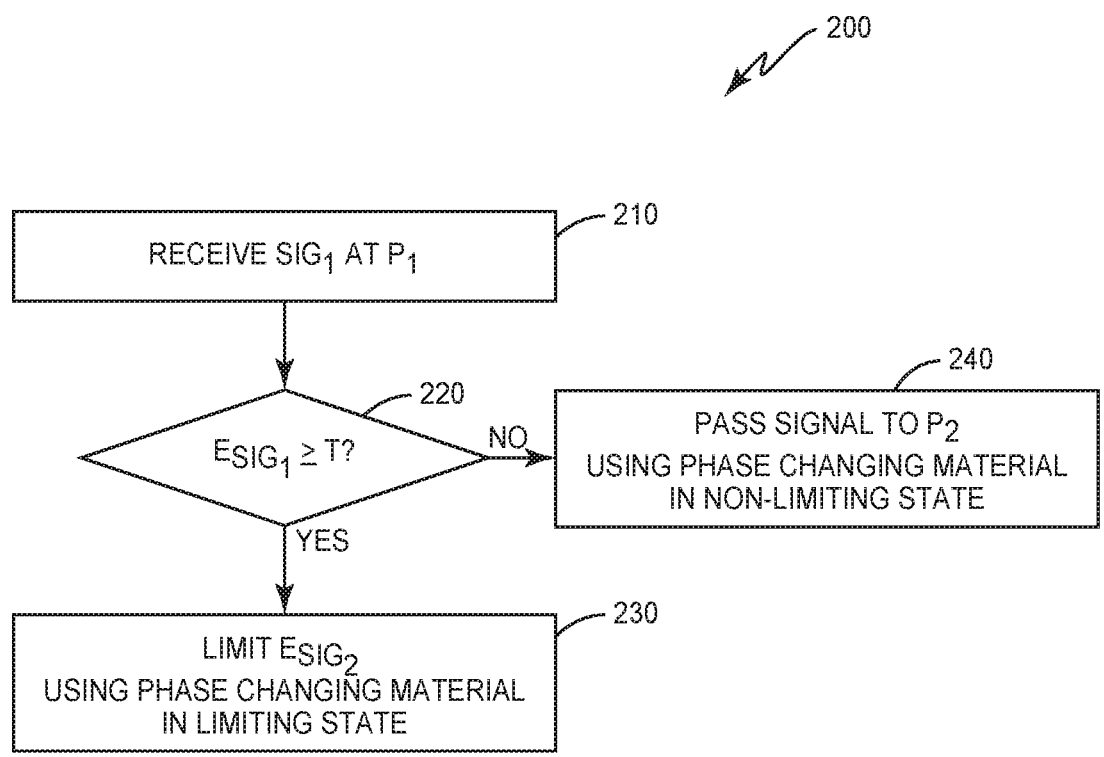
FIG. 2 shows a method of protecting electronic circuits from damage caused by high power signals according to one exemplary aspect.
Figure 3:
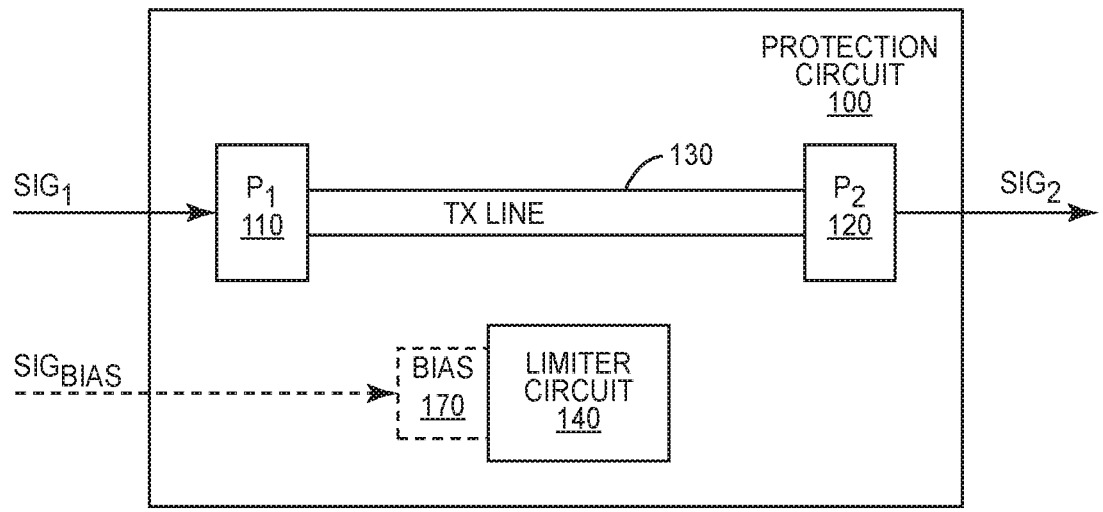
FIG. 3 shows a protection circuit according to one exemplary aspect.
Figure 4:
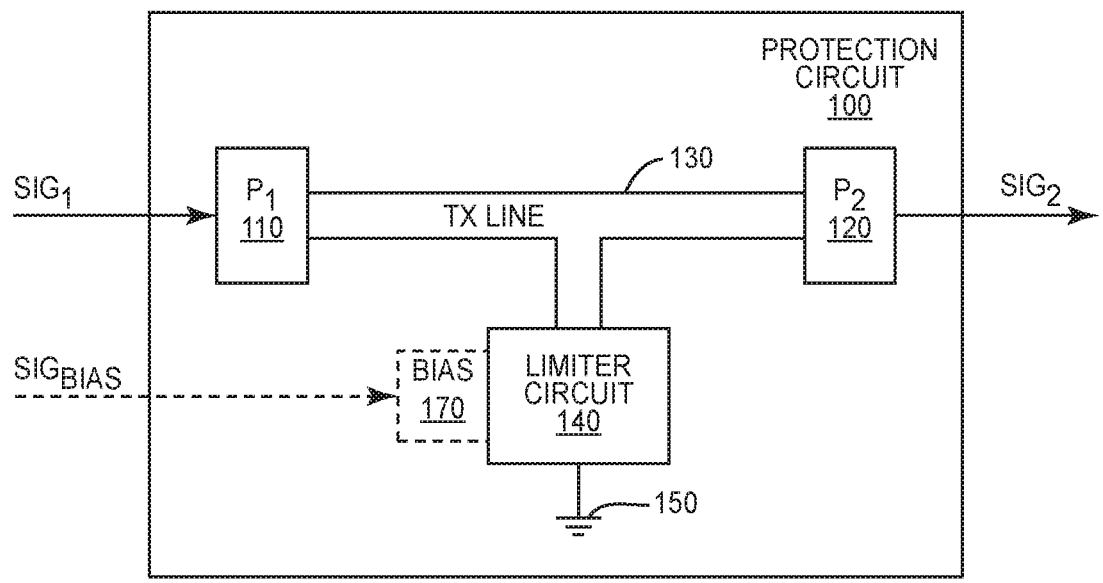
FIG. 4 shows a protection circuit according to another exemplary aspect.

FIG. 2 shows a method 200 of protecting the electronic circuits 12 using the protection circuit 100 according to aspects disclosed herein, where the protection circuit 100 comprises a first port $P_1$ 110 and a second port $P_2$ 120 on opposing ends of a transmission line 130 as shown in FIGS. 3 and 4, and where the second port 120 electrically connects to one or more of the electronic circuits 12. The protection circuit 100 also includes a limiter circuit 140 operatively connected to the transmission line 130, where the limiter circuit 140 includes a phase changing material in communication with a resonator. First port 110 receives a signal $SIG_1$ (block 210). When the energy of the received signal $SIG_1$ exceeds a threshold T (block 220), the protection circuit 100 limits an energy of the signal $SIG_2$ at the second port 120 using the phase changing material configured in a limiting state (block 230). When the energy of the received signal $SIG_1$ is less than the threshold T (block 220), however, the protection circuit 100 passes $SIG_1$ to the second port 120 using the phase changing material configured in a non-limiting state (block 240).

According to one aspect, the threshold T comprises a fixed threshold that is predetermined during manufacture, e.g., based on the sensitivities of the electronic circuits 12 connected to the protection circuit 100. Alternatively, the threshold may comprise a variable threshold, e.g., controlled by a bias signal $SIG_{BIAS}$. For this aspect, the protection circuit 100 may further comprise a bias connector 170, as shown in FIGS. 3 and 4, where a bias signal $SIG_{BIAS}$ applied to the bias connector 170 controls the threshold T. As such, protection circuit 100 may adjust the sensitivity of the limiter circuit 140 to the input signal as needed, e.g., in response to an increasing/decreasing sensitivity of one or more electronic circuits 12 to high power signals. Regardless of whether the threshold is fixed or variable, it will be appreciated that the threshold is set, or selected to be, at a level that prevents the corresponding electronic circuits 12 from being damaged. For example, the threshold may be set to protect a low-noise amplifier from signals greater than 1 Watt.

FIG. 3 shows an exemplary aspect of a protection circuit 100, where the limiter circuit 140 controls an impedance of the transmission line 130. More particularly, the limiter circuit 140 for this aspect selectively electromagnetically (e.g., capacitively or inductively) couples to the transmission line 130 responsive to the energy of the signal $SIG_1$ received at the first port 110, and thus selectively controls the impedance of the second port 120 relative to the impedance of the first port 110. To that end, when the phase changing material in the limiter circuit 140 is in a non-limiting state, the limiter circuit 140 is tuned to match the impedance of the transmission line 130, and thus does not electromagnetically couple to the transmission line 130. As such, the impedance of the second port 120 substantially matches the impedance of the first port 110, enabling the signal applied to the first port 110 to pass to the second port 120 with little to no insertion loss. When the energy of the signal $SIG_1$ applied to the first port 110 exceeds a threshold, however, the phase changing material transitions to a limiting state, causing the limiter circuit 140 to highly mismatch the impedance of the transmission line 130 via electromagnetic coupling. This electromagnetic coupling changes the impedance of the second port 120 relative to the first port 110. The resulting impedance mismatch attenuates the energy of the input signal $SIG_1$ by reflecting most, if not all, of the energy of $SIG_1$ back towards the first port 110, and thus limits the power of the signal $SIG_2$ output by the second port 120.

FIG. 4 shows another exemplary aspect of a protection circuit 100, where the limiter circuit 140 redirects high power input signals away from the second port 120. More particularly, the limiter circuit 140 for this aspect selectively connects the transmission line 130 to ground 150 responsive to the energy of the signal received at the first port 110, and thus selectively redirects the signal applied to the first port 110 to ground 150. To that end, when the phase changing material in the limiter circuit 140 is in a non-limiting state, the limiter circuit 140 is an open circuit that prevents the transmission line 130 from connecting to ground 150, enabling the signal applied to the first port 110 to pass to the second port 120 with little to no insertion loss. When the energy of the signal $SIG_1$ applied to the first port 110 exceeds a threshold, however, the phase changing material transitions to a limiting state, causing the limiter circuit 140 to electrically connect the transmission line 130 to ground 150. As such, when the phase changing material is in the limiting state, the limiter circuit 140 redirects the signal applied to the first port 110 to ground, preventing most, if not all, of $SIG_1$ from reaching the second port 120.

Figure 5:
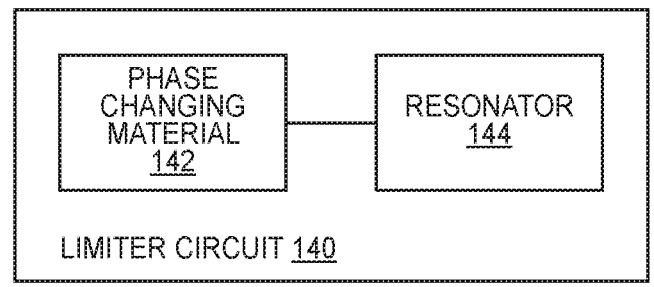
FIG. 5 shows a limiter circuit for the protection circuit according to one exemplary aspect.

FIG. 5 shows one exemplary aspect of a limiter circuit 140. As shown in FIG. 5, the limiter circuit 140 comprises phase changing material 142 incorporated inside selective parts or adjacent to the resonator 144. The phase changing material 142 may comprise any material that changes phase responsive to the energy of an applied input signal, including but not limited to air, a noble gas, a thermochromic material, an electrochromic material (e.g., vanadium dioxide $VO_2$), etc. It will be appreciated that in some aspects, the phase changing material 142 may absorb some of the energy of the signal applied to the first port 110 when the phase changing material 142 is in the limiting state. This property of the limiter circuit 140 depends on the material used for the phase changing material 142 and/or the actual orientation of the limiter circuit 140 relative to the transmission line 130. The phase changing material 142 in the conductive state, may it be a gas turned into plasma or an insulator material turned into a conductor, still has appreciable resistivity, and therefore absorbs some of the signal due to Joule heating. For example, when the phase changing material 142 creates a shunt from the transmission line 130 to ground 150, the high energy signal passes through the limiter circuit 140, resulting in at least some of the energy of $SIG_1$ being absorbed by the phase changing material 142.

Figure 6:
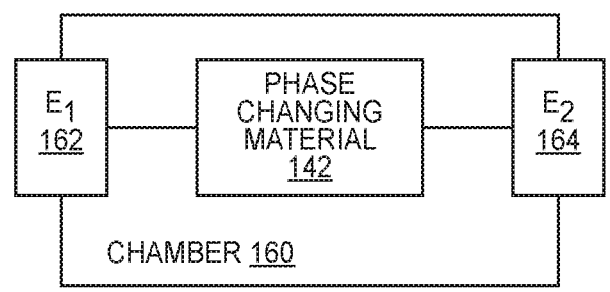
FIG. 6 shows a gap chip implementation of the phase changing material according to one exemplary aspect.

In some aspects, the protection circuit 100 is implemented using a gap chip 146, where the phase changing material 142 is disposed in a sealed chamber 160 of the gap chip 146. FIG. 6 shows an example of one such gap chip 146. In this example, the gap chip 146 comprises a chamber 160, the phase changing material 142, a first electrode 162 and a second electrode 164. The phase changing material 142 is disposed within the sealed chamber 160, while the electrodes 162, 164, are partially disposed within the sealed chamber 160 and extend from opposing sides of the sealed chamber 160, as shown in FIG. 6. As a result, when the phase changing material 142 is in a limiting state, e.g., responsive to a high power input signal $SIG_1$, the phase changing material 142 electrically connects the first electrode 162 to the second electrode 164, creating the desired limiting condition, e.g., a shunt to ground when the first electrode 162 connects to the transmission line 130 and the second electrode 164 connects to ground 150.

Figure 7:
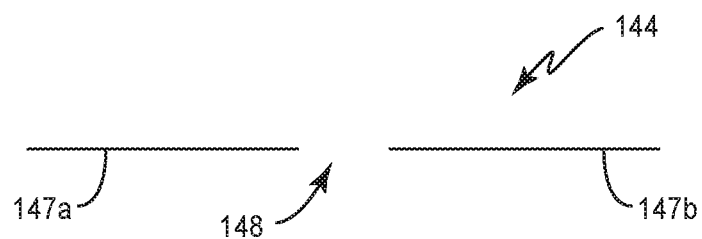
FIG. 7 shows an exemplary slot resonator for the limiter circuit.

The resonator 144 may comprise any known resonator, e.g., a slot resonator (FIGS. 7 and 9), quarter-wave resonator (FIG. 8), complementary split ring resonator (FIG. 11), etc. For example, resonator 144 may comprise a slot resonator having a slot or gap 148 disposed between two conductors 147a, 147b, as shown in FIG. 7. For this aspect, the phase changing material 142 is disposed in the gap 148 such that the phase changing material 142 only connects one conductor 147a to the other conductor 147b when the phase changing material 142 is in the limiting state. Alternatively, a gap chip 146 may be disposed between the two conductors 147a, 147b such that one conductor 147a only connects to the other conductor 147b when the phase changing material 142 in the sealed chamber 160 is in the limiting state.

Figure 8:
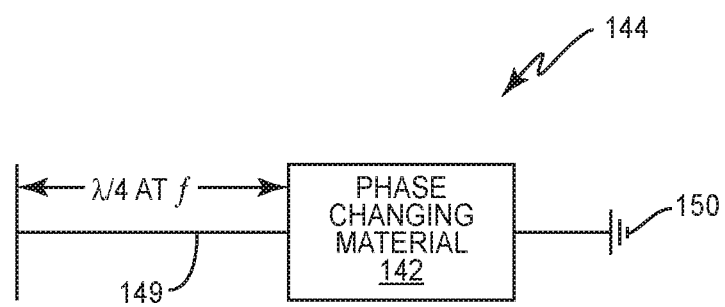
FIG. 8 shows an exemplary quarter-wave resonator for the limiter circuit.

According to another aspect, resonator 144 may comprise a quarter wave resonator, as shown in FIG. 8. For this aspect, a conductive element 149 having a length of one quarter of a wavelength (at a specified frequency) is connected to ground 150 by the phase changing material 142 when the phase changing material 142 is in the limiting state. Alternatively, gap chip 146 may be disposed between the conductive element 149 and ground 150 such that conductive element 149 only connects to ground 150 (and thus resonates) when the phase changing material 142 in the sealed chamber 160 is in the limiting state.

The protection circuit 100 may be added to any existing printed circuit board (PCB) implementations. For example, the protection circuit may be attached to a PCB using flip chip or wirebond technologies.

FIGS. 9-12 show exemplary PCB implementations of the aspects disclosed herein. FIG. 9 shows a PCB implementation of a protection circuit 100 implemented as a slot resonator (e.g., of FIG. 7) and used for selective electromagnetic coupling to the transmission line responsive to the power of the input signal. FIG. 10 shows a PCB implementation of a protection circuit 100 that redirects high power input signals to ground. While the aspects disclosed herein are generally described in terms of protection circuit 100 comprising a single limiter circuit 140, it will be appreciated that multiple limiter circuits 140 may be used, e.g., as shown in FIGS. 11 and 12. Such multiple limiter circuit solutions may be used, for example, to provide more than one redirection path, to increase the amount of power able to be handled by the protection circuit 100, to further decrease the signal level reaching the second port 120, etc.

Figure 13:
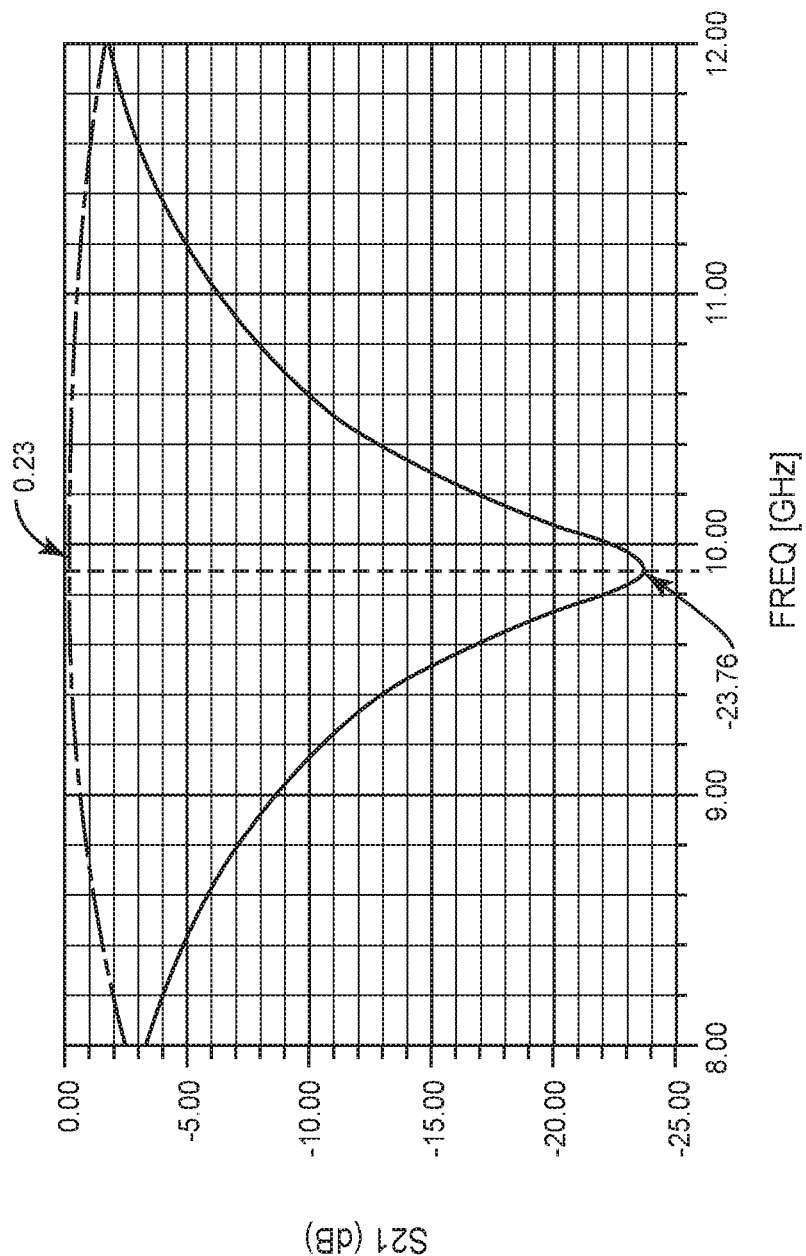
FIG. 13 shows simulation results for one exemplary aspect.

FIG. 13 shows performance data for a protection circuit 100 when implemented according to one exemplary aspect (e.g., the aspect of FIG. 9), where the resonator is configured for operation near 10 GHz. As shown in FIG. 13, the transmitted signal at the second port 120 is at −0.23 dB, or nearly 100% transmitted in the non-limiting state. In the limiting state, the transmitted signal at the second port 120 is at −23.76 dB, or attenuated more than 200 times. Better performance designs can be achieved depending on the specific requirements and device complexity.

The aspects disclosed herein have several advantages over conventional surge protection solutions, i.e., PIN diodes. For example, the protection circuits 100 disclosed herein are cheaper to implement (e.g., up to 90% cheaper), can handle higher input powers than the PIN diode (e.g., signals with up to 100 times more power or total energy), and have minimal insertion loss when in the non-limiting state (e.g., as compared to insertion losses of about 1 dB for PIN diodes).

The aspects disclosed herein may, of course, be carried out in other ways than those specifically set forth herein without departing from essential characteristics of the described protection circuit. The present embodiments are to be considered in all respects as illustrative and not restrictive, and all changes coming within the meaning and equivalency range of the appended claims are intended to be embraced therein.

What is claimed is:

1. A protection circuit configured to protect one or more electronic circuits from high power signals, the protection circuit comprising:
   a first port and a second port electrically connected to opposing ends of a transmission line, the second port operatively coupled to the one or more electronic circuits; and
   a limiter circuit operatively coupled to the transmission line and comprising a phase changing material in communication with a resonator, the phase changing material configured in a limiting state when an energy of a signal received at the first port exceeds a threshold to limit an energy of the signal at the second port;
   wherein the limiter circuit further comprises a bias connector electrically connected to the resonator; and
   wherein the threshold comprises a variable threshold controlled by a bias signal applied to the bias connector.

2. The protection circuit of claim 1 wherein the phase changing material is configured in a non-limiting state when the energy of the signal received at the first port is less than the threshold.

3. The protection circuit of claim 1 wherein:
   the limiter circuit is selectively electrically coupled between the transmission line and ground;
   the limiting state comprises a conductive state; and
   the phase changing material is configured in the conductive state when the energy of the signal received at the first port exceeds the threshold to redirect at least a portion of the energy of the signal received at the first port to the ground.

4. The protection circuit of claim 1 wherein:
   the limiter circuit is disposed proximate the transmission line;
   the limiting state comprises an electromagnetic coupling state; and
   the phase changing material is configured in the electromagnetic coupling state when the energy of the signal received at the first port exceeds the threshold to mismatch an impedance of the first port relative to an impedance of the second port.

5. The protection circuit of claim 1 wherein the phase changing material configured in the limiting state absorbs at least some of the energy of the signal received at the first port to limit the energy of the signal at the second port.

6. The protection circuit of claim 1 further comprising a gap chip comprising:
   a sealed chamber, wherein the phase changing material is disposed in the sealed chamber;
   a first conductor at least partially disposed within the sealed chamber and extending from the sealed chamber; and
   a second conductor spaced from the first conductor, the second conductor at least partially disposed within the sealed chamber and extending from the sealed chamber;
   wherein the first and second conductors electrically connect to the resonator.

7. The protection circuit of claim 6 wherein the phase changing material comprises air.

8. The protection circuit of claim 6 wherein the phase changing material comprises a noble gas, a thermochromic material, or an electrochromic material.

9. The protection circuit of claim 1 wherein:
   the resonator comprises a slot resonator comprising a gap between two conductive elements;
   the phase changing material is disposed in the gap; and
   the limiting state comprises a conductive state that electrically connects the two conductive elements of the slot resonator.

10. The protection circuit of claim 1 wherein:
    the resonator comprises a quarter wave resonator selectively connected to ground via the phase changing material; and
    the limiting state comprises a conductive state that electrically connects the quarter wave resonator to the ground.

11. A method of protecting one or more electronic circuits from high power signals, the method comprising:
    receiving a signal at a first port of a transmission line, the transmission line comprising the first port and a second port on opposing ends, the second port operatively coupled to the one or more electronic circuits; and
    limiting an energy of the signal at the second port when an energy of the signal received at the first port exceeds a threshold using a phase changing material configured in a limiting state, the phase changing material in communication with a resonator operatively connected to the transmission line;
    wherein the threshold comprises a variable threshold, the method further comprising controlling the threshold by controlling a bias signal applied to the resonator.

12. The method of claim 11 further comprising passing the energy of the signal at the first port to the second port when the energy of the signal received at the first port is less than the threshold using the phase changing material configured in a non-limiting state.

13. The method of claim 11 wherein:
    the limiting state comprises a conductive state;
    the phase changing material in communication with the resonator is selectively electrically coupled between the transmission line and ground; and
    limiting the energy of the signal at the second port comprises redirecting at least a portion of the signal received at the first port to ground by using the phase changing material configured in the conductive state responsive to the energy of the signal received at the first port exceeding the threshold.

14. The method of claim 11 wherein:

the limiting state comprises an electromagnetic coupling state;

the phase changing material in communication with the resonator is disposed proximate the transmission line; and limiting the energy of the signal at the second port comprises mismatching an impedance of the first port relative to the second port by using the phase changing material configured in the electromagnetic coupling state when the energy of the signal received at the first port exceeds the threshold.

15. An aircraft comprising:

one or more electronic circuits configured to control an operation of the aircraft; and a protection circuit comprising:
- a first port and a second port electrically connected to opposing ends of a transmission line, the second port operatively coupled to the one or more electronic circuits; and
- a limiter circuit operatively coupled to the transmission line and comprising a phase changing material in communication with a resonator, the phase changing material configured in a limiting state when an energy of a signal received at the first port exceeds a threshold to limit an energy of the signal at the second port;
- wherein the limiter circuit further comprises a bias connector electrically connected to the resonator; and
- wherein the threshold comprises a variable threshold controlled by a bias signal applied to the bias connector.

16. The aircraft of claim 15 wherein:

the limiter circuit is selectively electrically coupled between the transmission line and ground;

the limiting state comprises a conductive state; and the phase changing material is configured in the conductive state when the energy of the signal received at the first port exceeds the threshold to redirect at least a portion of the energy of the signal received at the first port to the ground.

17. The aircraft of claim 15 wherein:

the limiter circuit is disposed proximate the transmission line;

the limiting state comprises an electromagnetic coupling state; and the phase changing material is configured in the electromagnetic coupling state when the energy of the signal received at the first port exceeds the threshold to mismatch an impedance of the first port relative to an impedance of the second port.

18. The aircraft of claim 15 further comprising a gap chip comprising:
- a sealed chamber, wherein the phase changing material is disposed in the sealed chamber;
- a first conductor at least partially disposed within the sealed chamber and extending from the sealed chamber; and
- a second conductor spaced from the first conductor, the second conductor at least partially disposed within the sealed chamber and extending from the sealed chamber;
- wherein the first and second conductors electrically connect to the resonator.

19. The aircraft of claim 15 wherein:

the resonator comprises a slot resonator comprising a gap between two conductive elements;

the phase changing material is disposed in the gap; and the limiting state comprises a conductive state that electrically connects the two conductive elements of the slot resonator.

20. The aircraft of claim 15 wherein:

the resonator comprises a quarter wave resonator selectively connected to ground via the phase changing material; and the limiting state comprises a conductive state that electrically connects the quarter wave resonator to the ground.

* * * * *